United States Patent [19]
Lee

[11] Patent Number: 5,900,760
[45] Date of Patent: May 4, 1999

[54] LOW VOLTAGE ECL LATCH AND FLIP-FLOP

[75] Inventor: Sang-O Lee, Seoul, Rep. of Korea

[73] Assignee: Samsung Electronics, Co. Ltd., Suwon, Rep. of Korea

[21] Appl. No.: 08/859,018

[22] Filed: May 20, 1997

[30] Foreign Application Priority Data

May 22, 1996 [KR] Rep. of Korea .................. 96/17421

[51] Int. Cl.⁶ .................................................. H03K 3/289
[52] U.S. Cl. ........................................... 327/202; 327/218
[58] Field of Search .................................... 327/199–203, 327/208, 210–212, 214, 215, 218, 219; 326/12, 13, 66, 73, 77

[56] References Cited

U.S. PATENT DOCUMENTS

| | | | |
|---|---|---|---|
| 4,940,905 | 7/1990 | Kobayashi et al. | 327/187 |
| 5,220,212 | 6/1993 | Sinh | 326/126 |
| 5,359,241 | 10/1994 | Hasegawa et al. | 327/202 |
| 5,699,002 | 12/1997 | Hayakawa | 327/202 |

*Primary Examiner*—My-Trang Nu Ton
*Attorney, Agent, or Firm*—Marger Johnson, & McCollom P.C.

[57] ABSTRACT

An ECL latch circuit eliminates a transistor in a latch driver, thereby reducing the operating voltage required for the latch. The latch includes an input circuit having a differential pair of transistors which is coupled directly to a current source. A data latch is coupled to the input circuit, and a latch driver is coupled between the data latch and the current source. The latch circuit is driven with a single-ended clock signal which has a bias level that is higher than the bias level of a pair of complimentary data input signals. This causes the differential pair of transistors in the input circuit to turn off when the latch driver activates the data latch circuit. The data latch includes a differential pair of transistors coupled to latch a pair of complimentary data output signals. The latch driver includes a single transistor coupled to activate the data latch responsive to a single-ended clock signal. An ECL flip-flop circuit utilizes a pair of ECL latches, each of which has a differential pair of transistors which is coupled directly to a current source. The latches are connected in a master-slave configuration with a signal generator disposed between the two latches for generating the data input and clock signals for the slave latch responsive to the data output signals from the master latch.

9 Claims, 8 Drawing Sheets

Figure 2:
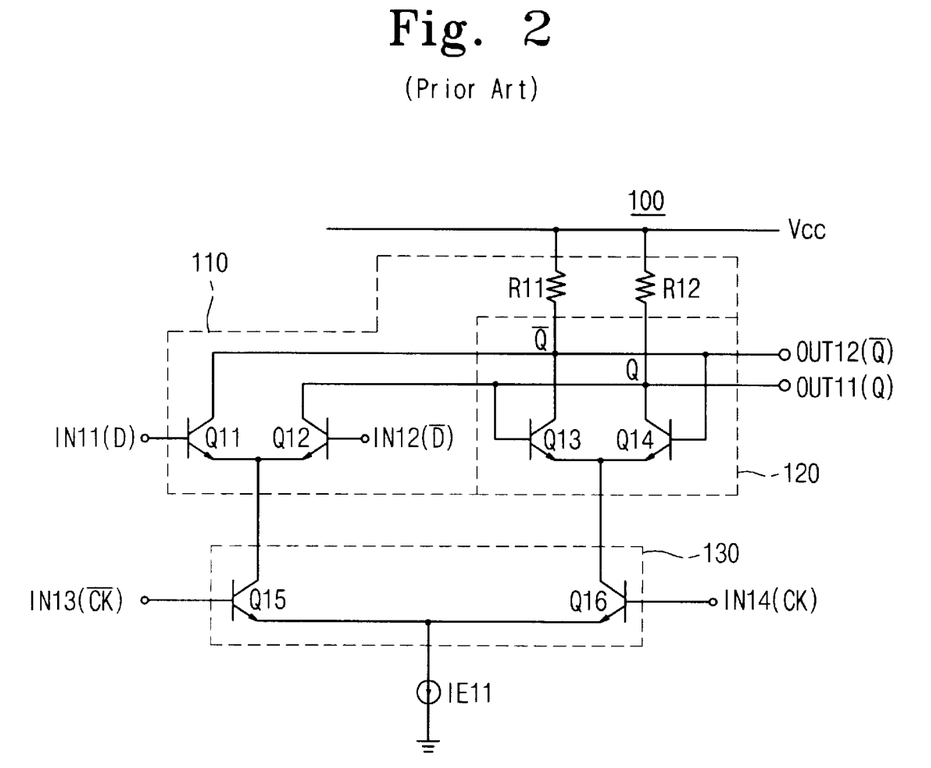
FIG. 2 is a schematic diagram of a prior art ECL edge-triggered D-type latch circuit.

Fig. 11 and "bias voltage level" denotes the central voltage level of the logic voltage swing range of a logic signal such as a data signal or clock signal. Referring to FIG. 2, the D-type latch circuit 100 includes four input terminals IN11, IN12, IN13 and IN14, and two output terminals OUT11 and OUT12. A pair of complimentary input data signal D and $\overline{D}$ having a bias voltage level $V_{BB11}$ are applied to input terminals IN11 and IN12, respectively. One clock signal CK having a bias voltage level which is $V_{BB12}$ lower than the level $V_{BB11}$ is applied to input terminal IN13. Another other clock signal $\overline{CK}$, which is a complimentary signal to CK is applied to input terminal IN14.

LOW VOLTAGE ECL LATCH AND FLIP-FLOP

This application corresponds to Korean patent application No. 96-17421 filed May 22, 1996 in the name of Samsung Electronics Co., Ltd. which is incorporated herein by reference for all purposes.

BACKGROUND OF THE INVENTION

1. Field of the Invention

This invention relates generally to emitter coupled logic (ECL) and more particularly to ECL latch and flip-flop circuits which operate at reduced voltages.

2. Description of the Related Art

Conventional edge-triggered D-type flip-flops are used in frequency dividers. Such flip-flops are constructed with two edge-triggered latch circuits.

Figure 1:
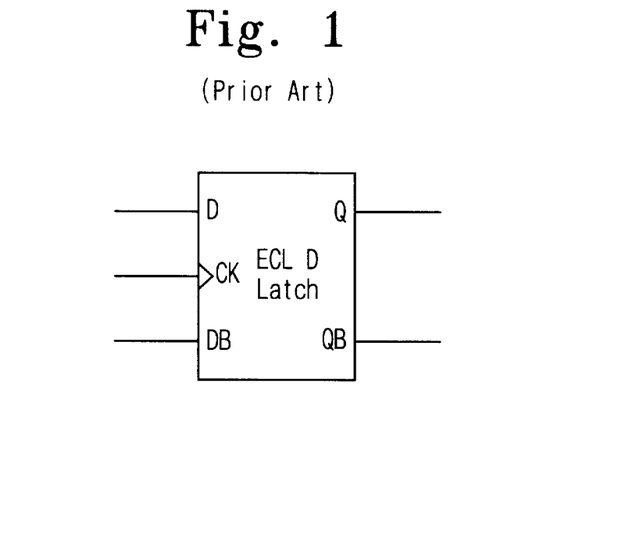
FIG. 1 is diagram showing a graphic symbol for an edge-triggered ECL D-type latch circuit.

FIG. 1 is diagram showing a graphic symbol for an edge-triggered ECL D-type latch circuit. The edge-triggered latch circuit receives input data signals D and $\overline{D}$ and transmits output data signals which correspond to the input data signals.

In FIG. 2, a conventional ECL edge-triggered D-type latch circuit is shown. In the following description, the term "bias voltage level" denotes the central voltage level of the logic voltage swing range of a logic signal such as a data signal or clock signal. Referring to FIG. 2, the D-type latch circuit 100 includes four input terminals IN11, IN12, IN13 and IN14, and two output terminals OUT11 and OUT12. A pair of complimentary input data signal D and $\overline{D}$ having a bias voltage level $V_{BB11}$ are applied to input terminals IN11 and IN12, respectively. One clock signal CK having a bias voltage level which is $V_{BB12}$ lower than the level $V_{BB11}$ is applied to input terminal IN13. Another other clock signal $\overline{CK}$, which is a complimentary signal to CK is applied to input terminal IN14.

An output data signal Q corresponding to the input data signal D is transmitted from output terminal OUT11, and the other output data signal $\overline{Q}$ being a complementary signal of the signal Q is transmitted from output terminal OUT12.

The latch circuit 100 further comprises input circuit 110, data latch 120, clock driver 130 and current source IE11. Input circuit 110 has two resistors R11 and R12 and two NPN bipolar transistors Q11 and Q12. The circuit 110 receives complementary input data signals D and $\overline{D}$ and generates complementary output data signals Q and $\overline{Q}$. The output data signals Q and $\overline{Q}$ are provided to output terminals OUT11 and OUT12 respectively. Data latch 120 also is made up of two transistors Q13 and Q14. The latch 120 latches the output data signals Q and $\overline{Q}$ while the clock signal CK is at a high level (and thus the clock signal $\overline{CK}$ is at a high level).

Clock driver 130 has two transistors Q15 and Q16 whose bases are connected to input terminals IN13 and IN14 respectively. The driver 130 enables data latch 120 to be activated while the clock signal CK is high.

Figure 3:
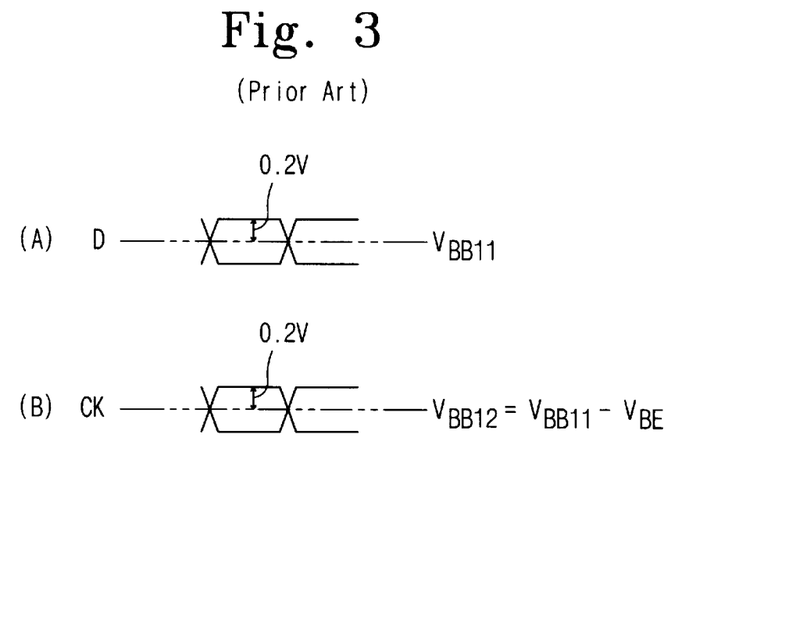
FIG. 3 is a waveform diagram showing the voltage levels of signals in the latch circuit shown in FIG. 2.

FIGS. 3A and 3B are waveform diagrams which show the voltage levels of the input/output data signals and clock signals which are applied to the ECL D-type latch circuit shown in FIG. 2. Referring to FIGS. 3A and 3B, the bias voltage level $V_{BB11}$ of the respective data signals D, $\overline{D}$, Q and $\overline{Q}$ is higher than the bias voltage level $V_{BB12}$ of clock signals CK and $\overline{CK}$ by an amount equal to the base-emitter voltage of a bipolar transistor (i.e., 0.8 volts).

Figure 4:
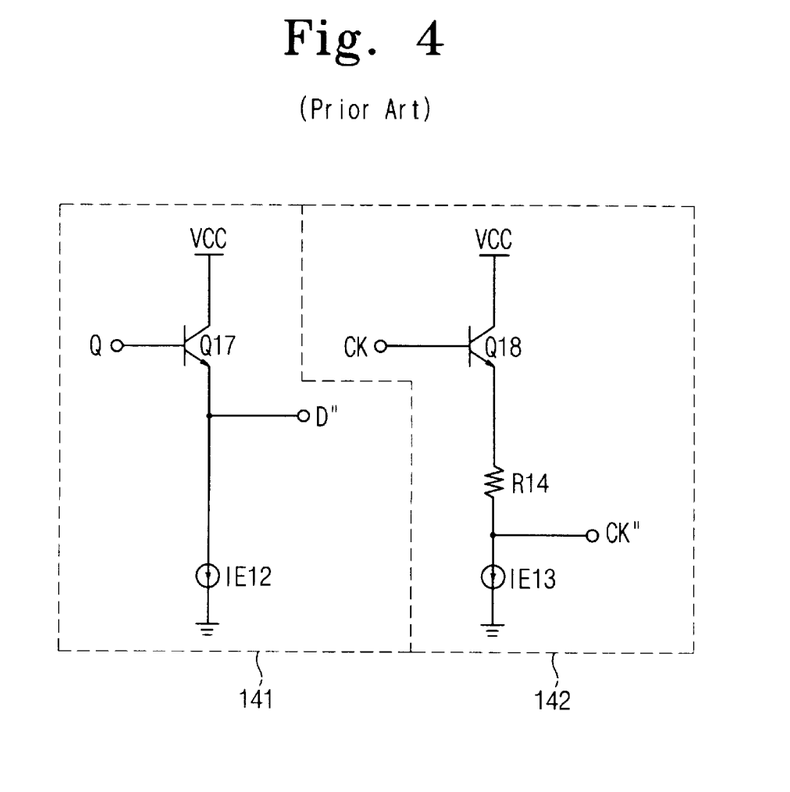
FIG. 4 is a schematic diagram of prior art output buffers for use with the latch circuit of FIG. 2.

In a cascade of ECL latch circuits, a front (master) latch circuit generally includes output buffers for the next (slave) latch circuit. The output buffers used in a Master-Slave D-type flip-flop circuit employing the latch circuit of FIG. 2 are shown in FIG. 4. The output buffers are made up of two signal generating circuits 141 and 142. Circuit 141 receives an output data signal Q from a front latch circuit (i.e., master latch circuit) and generates data D for the next latch circuit (i.e., slave latch circuit).

As shown in FIG. 4, signal generating circuit 141 includes a transistor Q17, a resistor R13 and a current source The input data signal D is obtained between emitter of the transistor Q17 and current source IE12. Signal generating circuit 142 receives a clock signal CK from an external signal source and generates a clock signal CK for the next latch (i.e., slave latch circuit). The circuit 142 includes a transistor Q18, a resistor R14 and a current source IE13. The data signal CK is obtained between the resistor R14 and the current source IE13.

Figure 5:
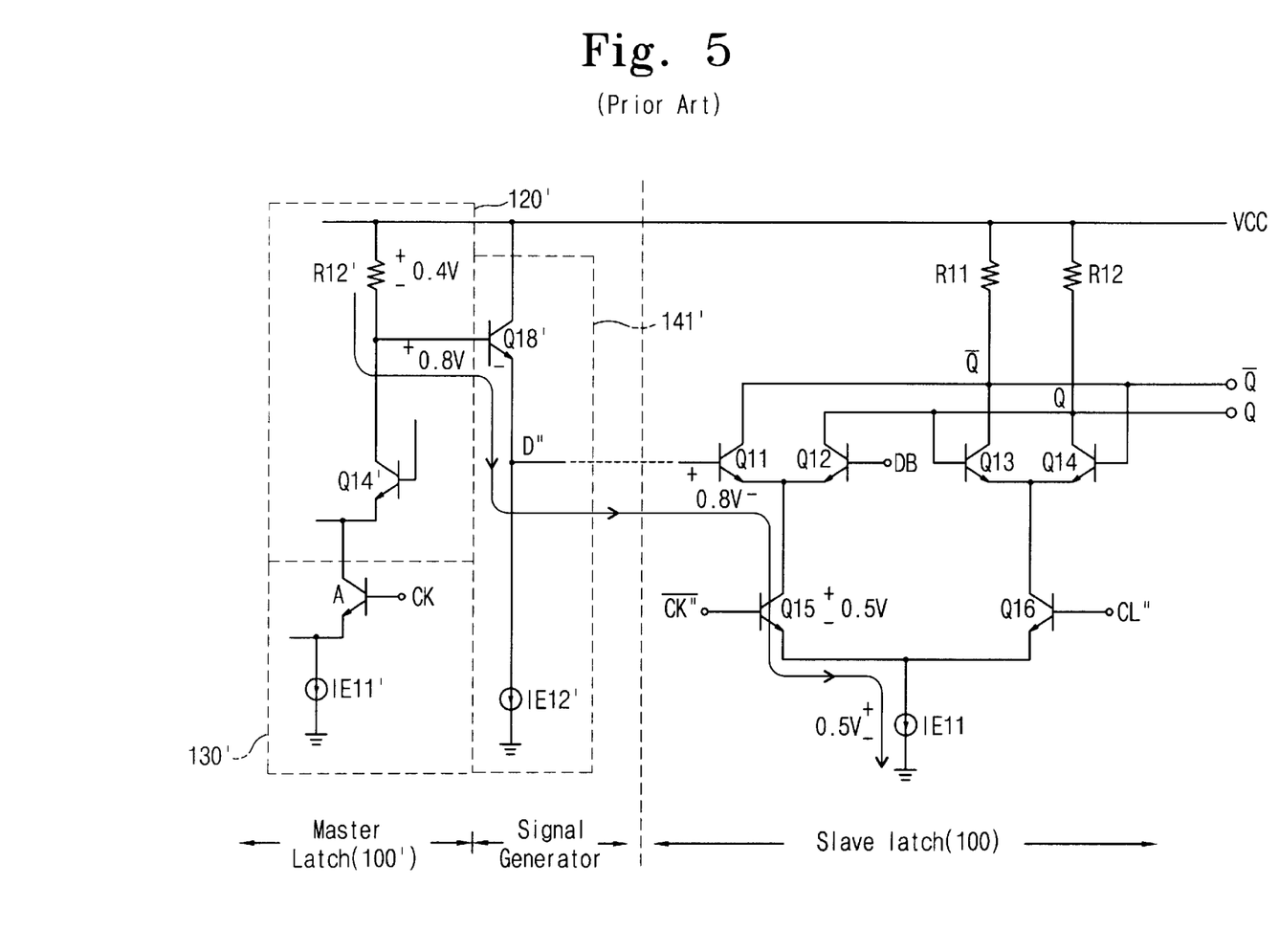
FIG. 5 is a schematic diagram which illustrates the supply voltage limit in a prior art flip-flop circuit employing the latch circuit and the output buffers shown in FIGS. 2 and 4.

FIG. 5 is a schematic circuit diagram which illustrates the supply voltage limit in a conventional Master-Slave D-type flip-flop circuit employing the latch circuit and the signal generator shown respectively in FIGS. 2 and 4. It is assumed that base-emitter voltage $V_{BE}$ of NPN transistor is 0.8 volts and collector-emitter voltage $V_{CE}$ thereof is 0.5 volts in consideration of signal swing. It is also assumed that, in the latch circuit, the drop voltage across the respective output drive resistors R11 and R12 is 0.4 volts and the voltage drop across the current source IE11 is 0.5 volts.

If the prior art ECL D-type latch circuit is implemented with a Master-Slave flip-flop circuit, as shown in FIG.5, there is a significant current path along the resistor R12' in the master circuit 100', the transistor 17' in the signal generator 141', the transistors Q11 and Q15 and the current source IE11 in the slave circuit 100. This path constrains the minimum supply voltage $V_{MIN}$ of the latch circuit. The voltage drop $V_{MIN}$ associated with the current path can calculated as follows:

$V_{MIN}$=0.4$V$(R12')+0.8$V$(Q17')+0.8$V$(Q11)+0.5$V$(Q15)+0.5$V$(IE11)= 3.0$V$

Since 3.0 volts may drop across the path, the minimum supply voltage $V_{MIN}$ required to operate the conventional latch circuit is greater than or equal to 3.0 volts. Therefore, the prior art ECL latch circuit can not be readily incorporated into semiconductor devices using a power supply voltage VCC that is less than 3.0 volts.

Accordingly, a need remains for an ECL latch circuit that can operate at reduced power supply voltages.

SUMMARY OF THE INVENTION

Therefore, it is an object of the present invention to operate an ECL latch circuit at low power supply voltage levels.

Another object of the present invention is to provide an ECL flip-flop that can operate at low power supply voltage levels.

To accomplish these and other objects, an ECL latch circuit in accordance with the present invention includes an input circuit having a differential pair of transistors which is coupled directly to the emitter of a clock driver in the latch. This eliminates the need for a second transistor in a clock driver, thereby eliminating a transistor in the current path between the power supply terminals and allowing the latch to operate at lower power supply voltages.

To accommodate this improved latch structure, the latch circuit is driven with a single-ended clock signal which has a bias level that is higher than the bias level of the complimentary data input signals. This causes the differential pair of transistors in the input circuit to turn off when the clock driver activates a data latch circuit.

One aspect of the present invention is an ECL latch circuit comprising an input circuit; a current source coupled to the input circuit; a data latch coupled to the input circuit; and a clock driver coupled between the data latch and the current source. The input circuit includes a differential pair of transistors coupled to receive a pair of complimentary input signals and to generate a pair of complimentary output signals. The data latch includes a differential pair of transistors coupled to latch a pair of complimentary output signals. The clock driver includes a single transistor coupled to activate the data latch responsive to a single-ended clock signal.

The input circuit is driven at a first bias voltage level, and the transistor in the clock driver is driven at a second bias voltage level such that the input circuit is deactivated when the clock driver activates the data latch.

Another aspect of the present invention is an ECL flip-flop circuit which utilizes a pair of ECL latches in accordance with the present invention. The latches are connected in a master-slave configuration with output buffers disposed between the two latches for providing the data input signals for the slave latch responsive to the data output signals from the master latch. The output buffers includes signal generation circuits that include an emitter follower transistor coupled in series with a resistor and a current source.

An advantage of the present invention is that it reduces the power supply voltage required to operate ECL latch and flip-flop circuits.

The foregoing and other objects, features and advantages of the invention will become more readily apparent from the following detailed description of a preferred embodiment of the invention which proceeds with reference to the accompanying drawings.

DETAILED DESCRIPTION

An ECL D-type latch circuit which can be operated from a supply voltage less than 3.0 volts and a D-type flip-flop circuit which employs the latch circuit are described below. In the following detailed description, numerous specific details are set forth, such as specific circuit configurations, components, etc., in order to provide a thorough understanding of the present invention. It will be apparent, however, to one skilled in the art that the present invention may be practiced without these specific details.

Figure 6:
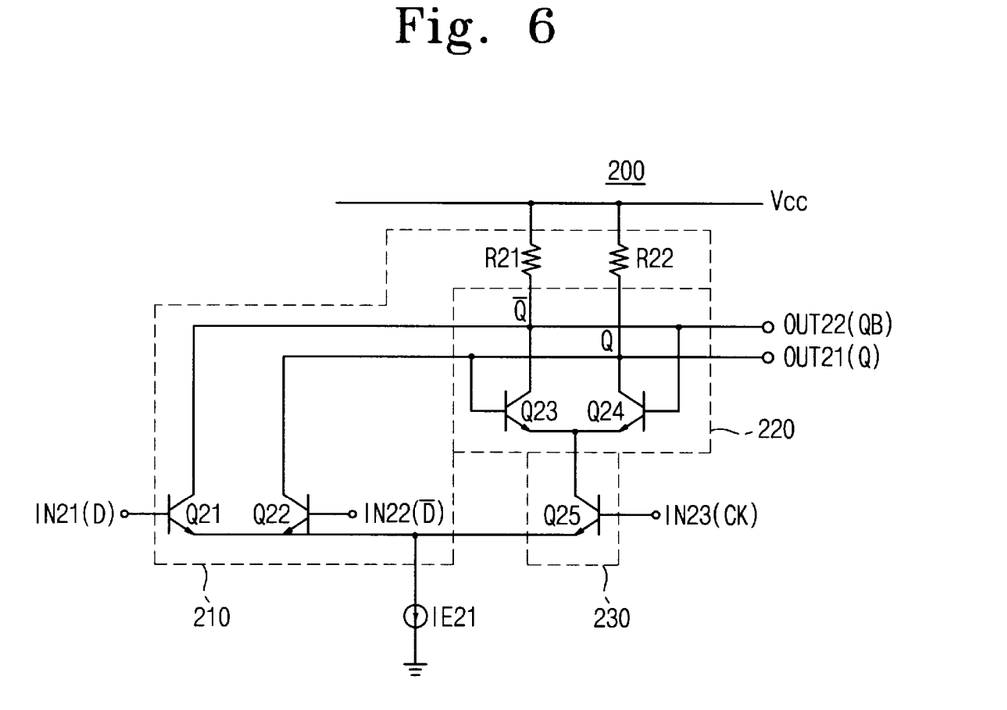
FIG. 6 is a schematic diagram of an embodiment of an ECL latch circuit in accordance with the present invention.

In FIG. 6, a preferred embodiment of an ECL D-type latch circuit according to the present invention is illustrated. Referring to FIG. 6, the ECL D-type latch circuit 200 includes three input terminals IN21, IN22 and IN23, and two output terminals OUT21 and OUT22. The ECL D-type latch circuit 200 includes input circuit 210, data latch 220, clock driver 230 and current source IE21.

An input data signal D, which has a bias voltage level (the central voltage level of its logic swing) of $V_{BB21}$, is applied to input terminal IN21. The other input data signal $\overline{D}$, which has the same bias voltage level $V_{BB21}$ as the signal D and is a complementary signal thereof, is applied to input terminal IN22. The input terminal IN23 is provided with a clock signal CK having a bias voltage level $V_{BB22}$ which is 0.2 volts higher than the level $V_{BB21}$ by 0.2 volts. An output data signal Q corresponding to the input data signal D is transmitted from output terminal OUT21, and the other output data signal $\overline{Q}$ being a complementary signal of the output data signal Q is transmitted from output terminal OUT22.

Input circuit 210 has two resistors R21 and R22 connected between a supply voltage VCC and output terminals OUT22 and OUT21, and two NPN bipolar transistors Q21 and Q22 that have bases connected to input terminals IN21 and IN22, respectively. The collectors of transistors Q21 and Q22 are connected to output terminals OUT22 and OUT2 1, respectively. The emitters of the transistors Q21 and Q22 are commonly connected to current source IE21. The circuit 210 receives complementary input data signals D and $\overline{D}$ and generates complementary output data signals Q and $\overline{Q}$. The output data signals Q and $\overline{Q}$ are provided to output terminals OUT21 and OUT22 respectively while the clock signal CK is at low level.

Data latch 220 has two transistors Q23 and Q24 that have bases connected to output terminals OUT21 and OUT22, respectively. The collectors of the transistors Q23 and Q24 are connected to output terminals OUT22 and OUT21, respectively. The latch 220 receives output data signals Q and $\overline{Q}$ at a leading or rising edge of the clock signal CK (i.e., when a High-to-Low level transition occurs) and latches the output data signals Q and $\overline{Q}$ until a subsequent trailing or falling edge occurs. In other words, data latch 220 latches the output data signals Q and $\overline{Q}$ while the clock signal CK is at high level.

Clock driver 230 has a transistor Q25 which has a base connected to input terminal IN23. The emitter of transistor Q25 is connected to ground through current source IE21, and the collector of Q25 is commonly connected to the emitters of transistors Q23 and Q24. The driver 230 enables data latch 220 to be activated during a time interval between a rising edge of the clock signal CK and a subsequent falling edge.

Figure 7:
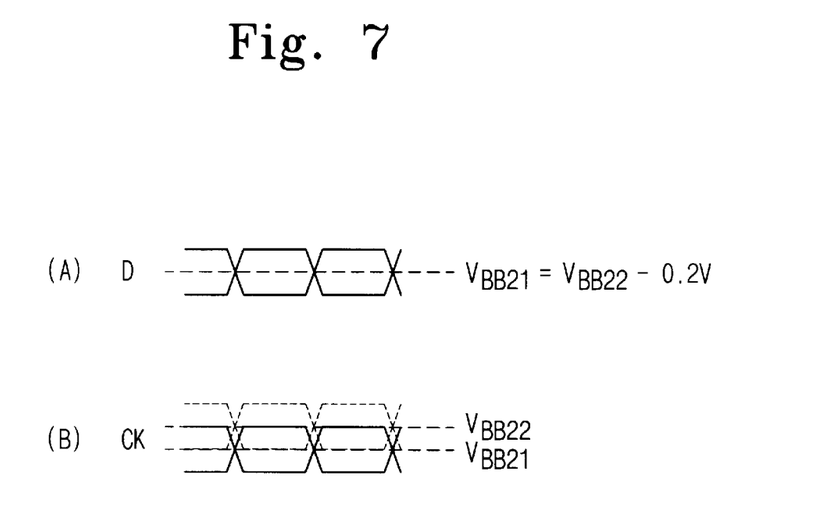
FIG. 7 is a waveform diagram showing the voltage levels of signals in the latch circuit shown in FIG. 6.

In FIGS. 7A and 7B, the voltage levels of the input/output data signals and the clock signal which are applied to the ECL D-type latch circuit of this embodiment are illustrated. Referring to FIGS. 7A and 7B, the bias voltage level $V_{BB21}$ of the respective data signals D, $\overline{D}$ is 0.2 volts lower than the bias voltage level $V_{BB22}$ of the clock signal CK. In other words, the clock signal CK has a bias voltage level higher than that of the respective input data signals by 0.2 volts. Further, the low level of the clock signal CK is equal to the bias voltage level of the respective data signals D, $\overline{D}$.

As described above, since the bias voltage level $V_{BB22}$ of the clock signal CK is higher than the level $V_{BB21}$ of the input data signal D or $\overline{D}$ by 0.2 volts, the low level of the clock signal CK is equal to the bias voltage level $V_{BB21}$ of the input data signal D or $\overline{D}$. Thus, on a falling edge of the clock signal CK, the transistor Q25 within latch driver 230 is turned off, so the transistors Q23 and Q24 within latch 220 are also turned off. Then, one of transistors Q21 and Q22 are turned on according to the states of the input data signals D and $\overline{D}$. Then, the output data signals Q and $\overline{Q}$, which correspond to the input signals D and $\overline{D}$, are transmitted via output terminals OUT21 and OUT22, respectively. For instance, if the input signal D goes to the high level, transistor Q21 within input circuit 210 is turned on. In contrast, the other transistor Q22 is then turned off since the input signal $\overline{D}$ goes low. In this case, the output signal Q having a high level is transmitted from the output terminal OUT21, while the output signal $\overline{Q}$ having a low level is transmitted from the output terminal OUT22.

On a rising edge of the clock signal CK, transistor Q25 within latch driver 230 starts to turn on. Then, one of the transistors Q23 and Q24 within the latch 220 is turned on. Assuming that the output data signal Q on terminal OUT21 is at high level, transistor Q23 is turned on and transistor Q24 is turned off. Therefore, the output signal Q on terminal OUT21 remains at a high level but the output data signal $\overline{Q}$ on terminal OUT22 remains at a low level. With this, the output data signals Q and $\overline{Q}$ on the output terminals OUT21 and OUT22 are latched by the transistors Q23 and Q24 during a rising edge of the clock signal CK. This condition is maintained until the next falling edge of the clock signal CK.

However, transistor Q25 conducts much more current than either of transistors Q21 and Q22 within input circuit 210 because the high level of the clock signal CK is higher than that of either input data signals D or $\overline{D}$ by 0.2 volts. In this case, the emitter voltages of transistors Q21, Q22 and Q25 increase, compared to the case of the falling edge. That is, the emitter voltages of transistors Q21, Q22 and Q25 is increased by almost 0.2 volts when the clock signal CK is fully high. Thus, although the input data signals D and $\overline{D}$ are applied to input terminals IN21 and IN22 respectively, neither of the transistors Q21 and Q22 within input circuit 210 will be turn on. On the other words, the input data signals D and $\overline{D}$ have no effect on the states of the output data signals Q and $\overline{Q}$ while the clock signal CK is at high level, i.e., the input circuit 210 is deactivated.

As described above, the ECL D-type latch circuit 200 receives the complementary input data signals D and $\overline{D}$ and generates the complementary output data signals Q and $\overline{Q}$ while the clock signal CK is at a low level, and latches the output data signals Q and $\overline{Q}$ while the clock signal CK is at high level. That is, input circuit 210 is activated by the input data signals D and $\overline{D}$ when the clock signal CK goes low, but the latch 220 is activated by clock driver 230 when the clock signal CK goes high.

Figure 8:
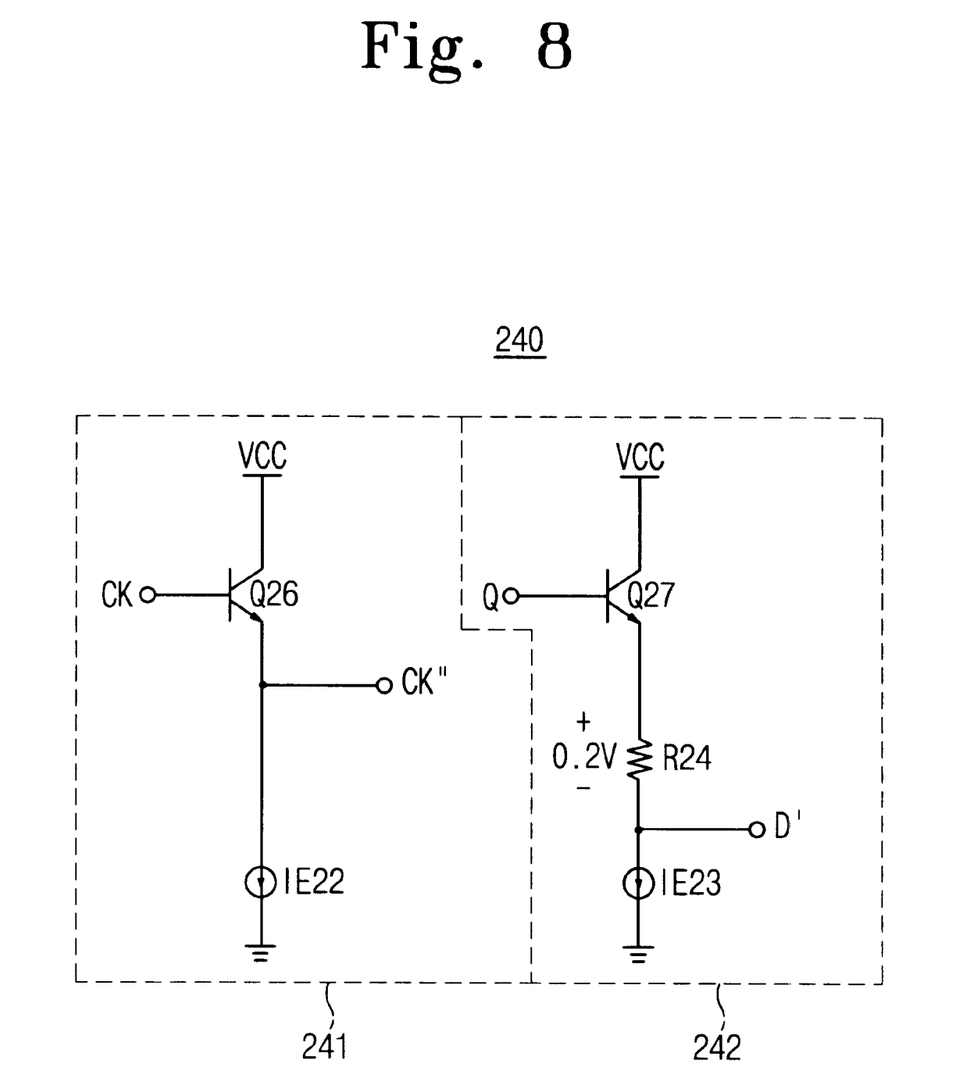
FIG. 8 is a schematic diagram of an embodiment of output buffers in accordance with the present invention for use with the latch circuit of FIG. 6.

FIG. 8 is a detailed circuit diagram of output buffers that can be used in a Master-Slave D-type flip-flop circuit employing a latch circuit in accordance with the present invention. Referring to FIG. 8, the output buffer 240 receives output data signals Q (or $\overline{Q}$) from a master latch circuit and a clock signal CK from an external signal source, and generates input data signal D' (or $\overline{D}'$) (referred to as 'internal input data signals', 'next-input data signals', or 'slave input data signals') having the bias voltage level $V_{BB21}$ and a clock signal CK' (referred to 'internal clock signal' or 'next-clock signal' or 'slave clock signal') having the bias voltage level $V_{BB22}$ for a slave latch circuit.

Output buffer 240 is made up of two signal generating circuits 241 and 242. Circuit 241 receives a clock signal CK from an external signal source and generates a slave input data signal D' and a slave clock signal CK' for a next latch circuit (i.e., slave latch circuit). As shown in FIG. 8, signal generating circuit 241 includes a transistor Q26 and a current source IE22. The base of transistor Q26 is connected to a clock signal CK. The collector of Q26 is connected to the supply voltage VCC. The emitter of transistor Q26 is connected to current source IE22. The slave clock signal CK' is obtained from a node between the emitter of the transistor Q26 and current source IE22.

Signal generating circuit 242 receives an output data signal Q from the master latch circuit of the front stage and generates a slave input data signal D'. The circuit 242 includes a transistor Q27, a resistor R24 and a current source IE23. The base of transistor Q27 is connected to the output terminal OUT21 of the master latch circuit (See FIG. 6), The collector of Q27 is connected to the supply voltage VCC. The emitter of transistor Q27 is connected to current source IE23 through resistor R24. The slave input data signal D' is obtained from a node between resistor R24 and current source IE23. The voltage drop drops across the resistor R24 is 0.2 volts.

Figure 9:
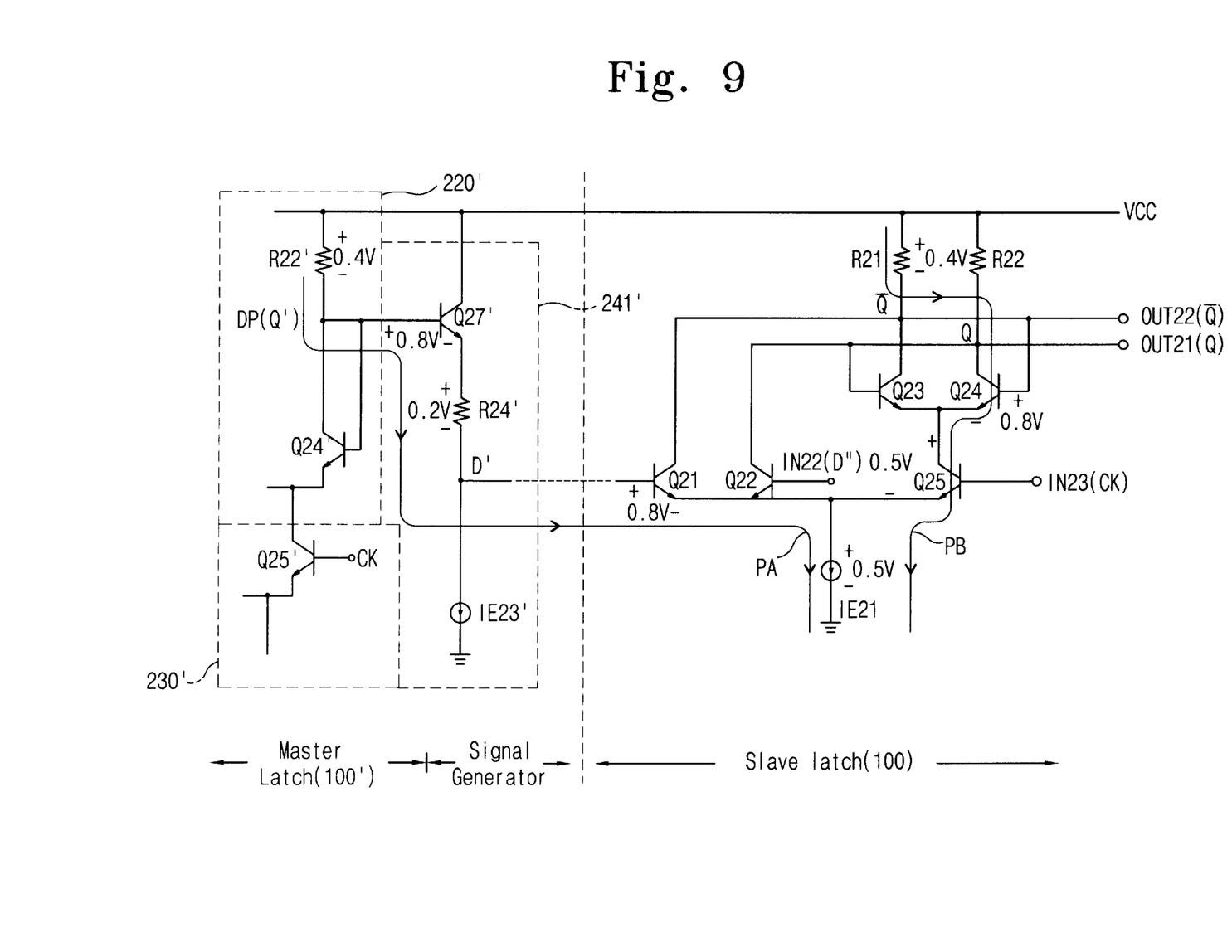
FIG. 9 is a schematic diagram which illustrates the reduced supply voltage operation of an embodiment of a flip-flop circuit employing the latch circuit of FIG. 6 and the signal generator of FIG. 8.

Referring to FIG. 9, the supply voltage limit in a Master-Slave D-type flip-flop circuit which employs a latch circuit and output buffer according to the present invention will be described. Herein, it is assumed that base-emitter voltage $V_{BE}$ of NPN transistor is 0.8 volts, and the collector-emitter voltage $V_{CE}$ is 0.5 volts in consideration of the signal swing thereof It will also be assumed that the voltage drop across the respective output drive resistors R21 and R22 is 0.4 volts and the voltage drop across the current source IE21 is 0.5 volts. If an ECL D-type latch circuit in accordance with the present invention is used to implement a Master-Slave flip-flop circuit, as shown in FIG. 9, there are two significant current paths to consider with respect to minimum supply voltage $V_{MIN}$ required for the latch circuit. One is path PA along resistor R22' in the master circuit 200', transistor Q26', resistor R23' in the output buffer 240, transistor Q21 and current source IE21 in the slave circuit 200. The other is path PB along resistor R21 or R22, transistor Q23 or Q24, transistor Q25 and current source IE23 in the slave circuit 200. The drop voltage $V_{PA}$ associated with the path PA and the drop voltage $V_{PB}$ are as follows:

$V_{PA}$=0.4V(R22')+0.8V(Q26')+0.2V(R23')+0.8V(Q21)+0.5V(IE21)= 2.7V $V_{PB}$=0.4V(R22)+0.8V(Q24)+0.5V(Q25)+0.5V(IE21)=2.2V

Thus, the path PA becomes the critical path for determining the minimum supply voltage $V_{MIN}$ of the latch circuit. That is, the minimum supply voltage $V_{MIN}$ required to operate the latch circuit of the invention is 2.7 volts. This is lower than that required for the prior art circuit by 0.3 volts. Thus, an ECL latch circuit in accordance with the present invention can be incorporated into semiconductor devices using a power supply voltage VCC less than 3.0 volts.

Figure 10:
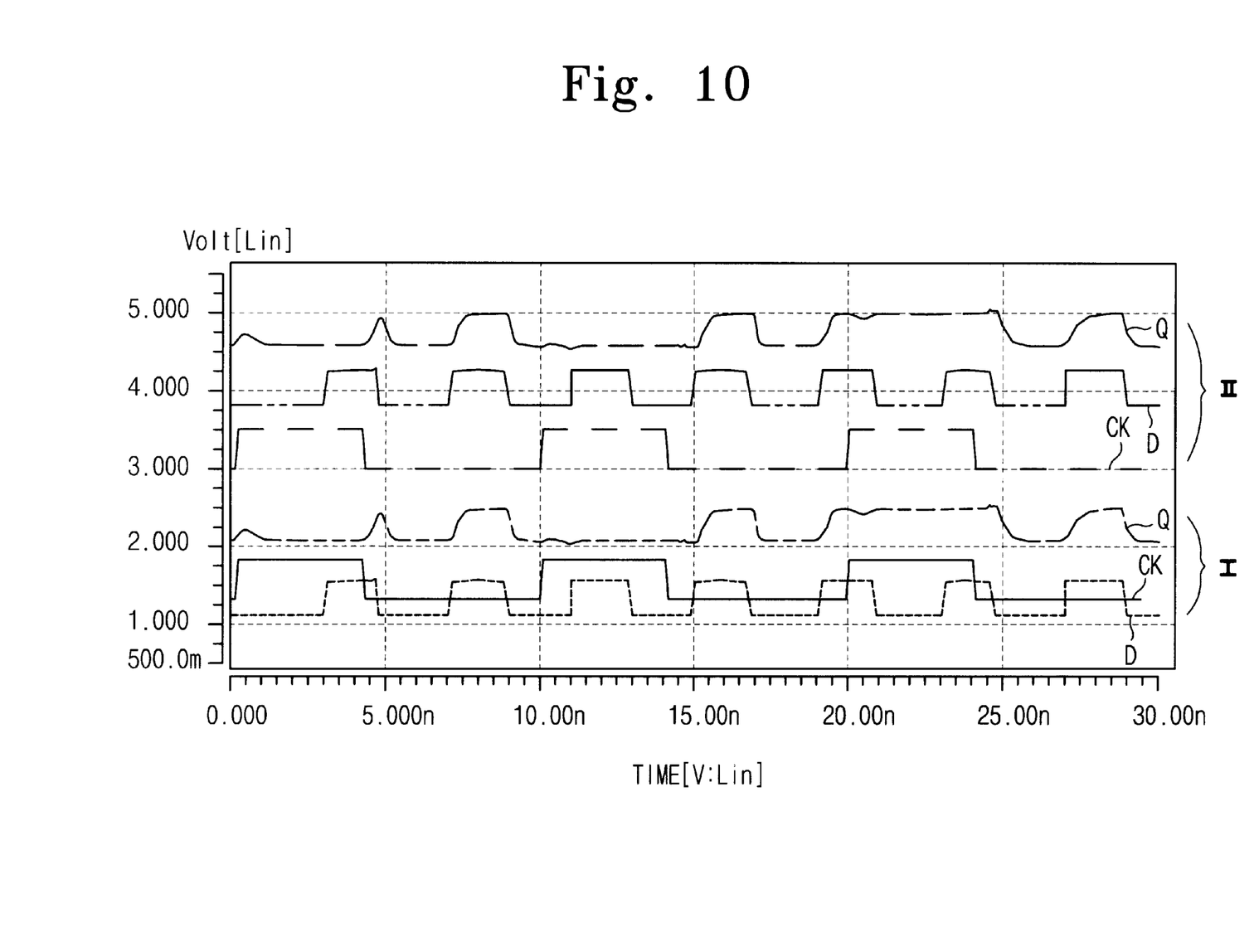
FIG. 10 is a waveform diagram showing a comparison of simulation waveforms for a prior art ECL latch circuit and an embodiment of an ECL latch circuit in accordance with the present invention.

FIG. 10 is simulation results that compares the electric operating characteristics of the prior art latch circuit with those of a latch circuit in accordance with the present invention. The simulations were performed using SPICE a clock frequency of 100 MHZ, an input data frequency of 240 MHZ, 900 uA current flowing through the respective current sources IE11 and IE21, 5.0 volts VCC for the prior art circuit, and 2.5 volts VCC for the present invention. In the figure, roman numerals I and II designate the output waveforms of the present invention and the prior art, respectively. Referring to the figure, it can be seen that the present invention has the same output waveforms as the prior art. Thus an ECL D-type latch circuit in accordance with the present invention can be operated with a lower supply voltage than conventional ones.

Figure 11:
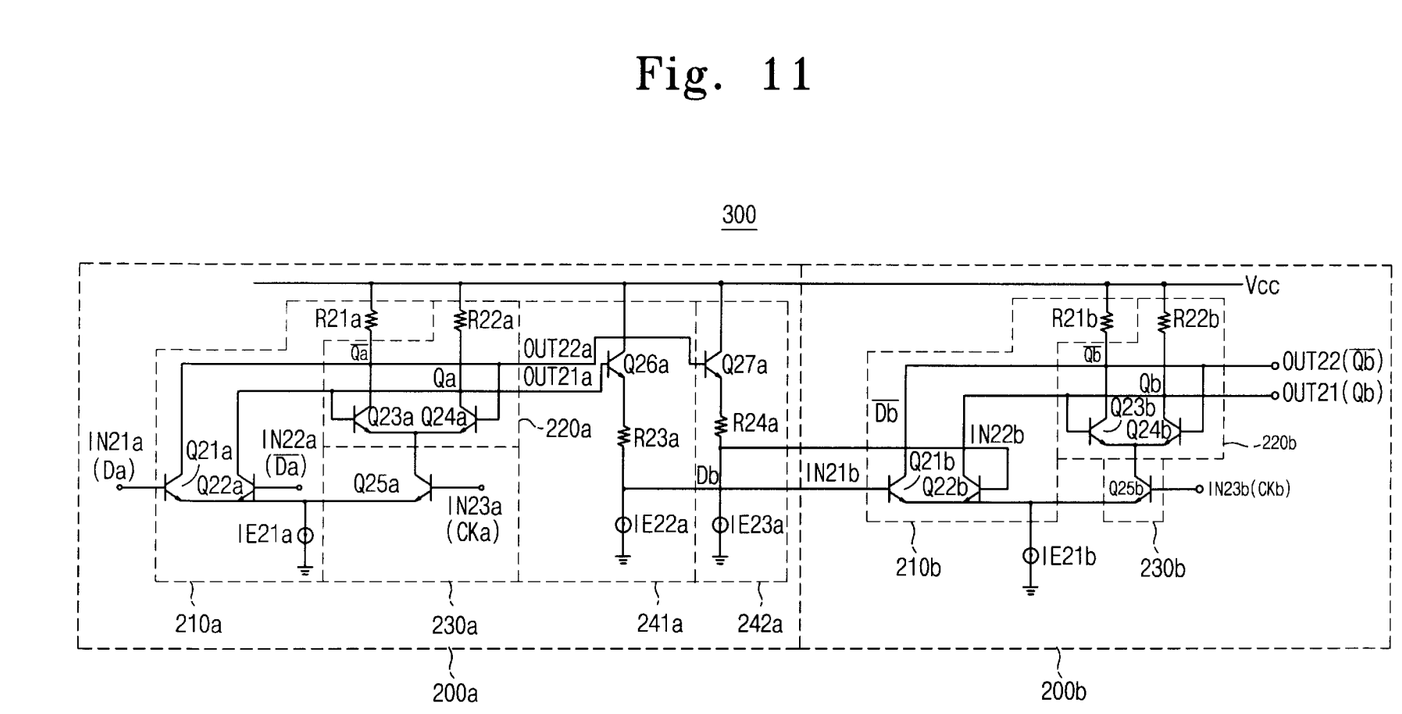
FIG. 11 is a schematic diagram of an embodiment of an ECL Master-Slave D-type flip-flop circuit constructed in accordance with the present invention.

FIG. 11 shows a Master-Slave D-type flip-flop circuit constructed in accordance with the present invention. Referring to FIG. 11, a low voltage operable ECL D-type flip-flop circuit 300 includes a master D-type latch circuit 200a and a slave D-type latch circuit 200b.

Master latch circuit 200a has a first input terminal IN21a for receiving a first input data signal Da having a bias voltage level $V_{BB21}$, a second input terminal IN22a for receiving a second input data signal $\overline{Da}$ which has the same bias voltage level as the first input data signal Da and is a complementary signal of the first input data signal Da, and a third input terminal IN23a for receiving a clock signal CKa which has a bias voltage level $V_{BB22}$ which is higher than the voltage level $V_{BB21}$.

Master latch circuit 200a includes input circuit 210a, data latch 220a, clock driver 230a, current source IE21a, and two output buffers 241a and 242a.

Input circuit 210a includes two resistors R21a and R22a connected between the power supply VCC and nodes OUT22a and OUT21a. The input circuit also includes two transistors Q21a and Q22a. The transistor Q21 has a base connected to input terminal IN21a, an emitter connected to current source IE21a, and a collector connected to node OUT22a. The transistor Q22a has a base connected to input terminal IN22a, an emitter connected to current source IN21a, and a collector connected to node OUT21a. Circuit 210a receives the first and second input data signals Da and $\overline{Da}$ on a falling edge of clock signal CKa and generates a first internal data signal Qa and a second internal data signal $\overline{Qa}$ which are provided to first and second nodes OUT21a and OUT22a, respectively, while clock signal CKa is at a low level.

The data latch 220a includes two transistors Q23a and Q24a. The transistor Q23a has a base connected to node OUT21a, an emitter connected to clock driver 230a, and a collector connected to node OUT22a. The transistor Q24a has a base connected to node OUT22a, an emitter connected to clock driver 230a, and a collector connected to node OUT21a. Data latch 220a latches the first and second internal data signals Qa and $\overline{Qa}$ at the first and second nodes OUT21a and OUT22a while the clock signal CKa is at high level.

The clock driver 230a includes a transistor having a base connected to input terminal IN23a, an emitter connected to current source IE21a, and a collector commonly connected to the emitters of the transistors Q23a and Q24a within data latch 220a. Clock driver 230 drives the data latch 220a to be activated while the clock signal CKa is at high level.

The first output 241a includes a transistor Q26a, a resistor R23a and a current source IE22a. The transistor Q26a has a base connected to node OUT21a, a collector connected to the supply voltage VCC, and an emitter connected to resistor R23a. The Circuit 241a receives the first internal data signal Qa on node OUT21 to generate a third internal data signal Db having the bias voltage level $V_{BB21}$.

The output buffer 242a includes a transistor Q27a, a resistor R24a and a current source IE23a. The transistor Q27a has a base connected to node OUT22a, a collector connected to the supply voltage VCC, and an emitter connected to resistor R24a. The output buffer 242a receives the second internal data signal $\overline{Qa}$ on node OUT22 to generate a fourth internal data signal $\overline{Db}$ having the bias voltage level $V_{BB2}$.

Slave latch circuit 200b has a node IN21b to which the third internal data signal Db is applied, a node IN22b to which the fourth internal data signals $\overline{Db}$ is applied, and a node IN23b to which an external clock signal /CKb is applied. Slave latch 200b also includes a first output terminal OUT21b for transmitting a first output data signal Qb which corresponds to the third internal data signal Db and a second output terminal OUT22b for transmitting a second output data signal $\overline{Qb}$ which is a complementary signal of the first output data signal Qb.

The slave latch circuit 200b further includes input circuit 210b for generating a fifth internal data signal Qb and a sixth internal data signal $\overline{Qb}$ in response to the third and fourth internal data signals Db and $\overline{Db}$ and for providing the fifth and sixth internal data signals Qb and $\overline{Qb}$ to the first and second output terminals OUT21b and OUT22b, respectively, while the internal clock signal /CKb is at a low level. The slave latch circuit 200b further includes data latch 220b for latching the fifth and sixth internal data signals Qb and $\overline{Qb}$ at the first and second output terminals OUT21b and OUT22b while the internal clock signal /CKb is at a high level. The slave latch circuit 200b further includes a clock driver 230b for driving data latch 220b to be activated while the internal clock signal CKb is at a high level, and a current source IE21b which is commonly connected to input circuit 210b and clock driver 230b.

Input circuit R21b includes a resistors R21b and R22b, and two transistors Q21b and Q22b. The resistors R21b and R22b are connected between the power supply VCC and output terminal Q22b and Q21b, respectively. The base of the transistor Q21b is connected to a node between resistor R23a and current source IE22a within the output buffer 241a. The emitter thereof is connected to current source IE21b, and the collector thereof is connected to output terminal OUT22b. The base of the transistor Q22b is connected to a node between resistor R24a and current source IE23a within output buffer 242a. The emitter thereof is connected to current source IE21b, and the collector thereof is connected to output terminal OUT21b. Circuit 210b receives the first and second input data signals Db and $\overline{Db}$ on a falling edge of the clock signal /Ckb and generates a first internal data signal Qb and a second internal data signal $\overline{Qb}$ which are provided to first and second output terminals OUT21b and OUT22b, respectively, while clock signal /CKb is at a low level.

The data latch 220b includes two transistors Q23b and Q24b. The base of the transistor Q23b is connected to output terminal OUT21b, the emitter thereof is connected to the clock driver 230b, and the collector thereof is connected to output terminal OUT22b. The base of the transistor Q24b is connected to output terminal OUT22b, the emitter thereof is connected to the clock driver 230b, and the collector thereof is connected to output terminal OUT21b.

The clock driver 230b includes a transistor Q25b having a base connected to a clock signal /CKb from an external signal source. The emitter of Q25b is connected to current source IE21b, and the collector is commonly connected to the emitters of the transistors Q23b and Q24b within the data latch 220b.

Having described and illustrated the principles of the invention in a preferred embodiment thereof, it should be apparent that the invention can be modified in arrangement and detail without departing from such principles. We claim all modifications and variations coming within the spirit and scope of the following claims.

I claim:

1. A flip-flop circuit comprising:
a slave latch circuit including a slave input circuit, a slave current source coupled to the slave input circuit, a slave data latch coupled to the slave input circuit, and a slave latch driver coupled between the slave data latch and the slave current source;
a signal generator coupled to the slave input circuit and the slave latch driver; and
a master latch circuit coupled to the signal generator;
wherein the master latch circuit includes a master input circuit, a master current source coupled to the master input circuit, a master data latch coupled to the master input circuit, and a master latch driver coupled between the master data latch and the master current source.

2. A flip-flop circuit according to claim 1 wherein:
the slave input circuit includes:
a first transistor having a first terminal coupled to receive a first slave input signal, a second terminal coupled to the slave current source, and a third terminal coupled to a first slave output terminal,
a second transistor having a first terminal coupled to receive a second slave input signal, a second terminal coupled to the slave current source, and a third terminal coupled to a second slave output terminal, and
a first resistor coupled between the first slave output terminal and a power supply; the slave latch driver includes a third transistor having a first terminal coupled to receive a slave clock signal, a second terminal coupled to the slave current source, and a third terminal coupled to the slave data latch;
the slave data latch includes:
a fourth transistor having a first terminal coupled to the second slave output terminal, a second terminal coupled to the slave latch driver, and a third terminal coupled to the first slave output terminal,
a fifth transistor having a first terminal coupled to the first slave output terminal, a second terminal coupled to the slave latch driver, and a third terminal coupled to the second slave output terminal, and
a second resistor coupled between the second slave output terminal and the power supply.

3. A flip-flop circuit according to claim 2 wherein:
the master input circuit includes:
a sixth transistor having a first terminal coupled to receive a first master input signal, a second terminal coupled to the master current source, and a third terminal coupled to a first master output terminal,
a seventh transistor having a first terminal coupled to receive a second master input signal, a second terminal coupled to the master current source, and a third terminal coupled to a second master output terminal, and
a third resistor coupled between the first master output terminal and the power supply;
the master latch driver includes an eighth transistor having a first terminal coupled to receive a master clock signal, a second terminal coupled to the master current source, and a third terminal coupled to the master data latch;
the master data latch includes:
a ninth transistor having a first terminal coupled to the second master output terminal, a second terminal coupled to the master latch driver, and a third terminal coupled to the first master output terminal,
a tenth transistor having a first terminal coupled to the first master output terminal, a second terminal coupled to the master latch driver, and a third terminal coupled to the second master output terminal, and
a fourth resistor coupled between the second master output terminal and the power supply.

4. A flip-flop circuit according to claim 3 wherein the signal generator includes:
an eleventh transistor having a first terminal coupled to the second master output terminal, a second terminal coupled to the power supply, and a third terminal coupled to the first terminal of the third transistor;
a twelfth transistor having a first terminal coupled to the first master output terminal, a second terminal coupled to the power supply, and a third terminal;
a first current source coupled to the first terminal of the first transistor;
a second current source coupled to the first terminal of the second transistor;
a fifth resistor coupled between the first current source and the third terminal of the eleventh transistor; and
a sixth resistor coupled between the second current source and the third terminal of the twelfth transistor.

5. An ECL flip-flop circuit comprising:
a slave latch circuit including a slave input circuit, a slave current source coupled to the slave input circuit, a slave data latch coupled to the slave input circuit, and a slave latch driver coupled between the slave data latch and the slave current source; and
a signal generator coupled to the slave input circuit and the slave latch driver;
wherein:
the slave input circuit includes a differential pair of transistors coupled to receive a first slave input signal and a second slave input signal and to generate a pair of complimentary slave output signals; and
the slave latch driver includes a transistor coupled to activate the slave data latch responsive to a slave clock signal;
wherein the signal generator includes:
a first transistor having a first terminal coupled to a power supply, a second terminal coupled to receive a first master output signal, and a third terminal coupled to a first node;
a first current source coupled to a second node; and
a first resistor coupled between the first and second nodes; and
wherein the signal generator generates the slave clock signal at the first node and the first slave input signal at the second node.

6. A flip-flop circuit according to claim 5 wherein the signal generator further includes:
a second transistor having a first terminal coupled to the power supply, a second terminal coupled to receive a second master output signal, and a third terminal coupled to a third node;

a second current source coupled to a fourth node; and a second resistor coupled between the third and fourth nodes;

wherein the signal generator generates the second slave input signal at the fourth node.

7. An ECL latch circuit comprising:

a first input terminal for receiving a first input data signal having a first bias voltage level;

a second input terminal for receiving a second input data signal having the first bias voltage level, the second input data signal being a complementary signal of the first input data signal;

a third input terminal for receiving a clock signal having a second bias voltage level higher than the first bias voltage level;

a first output terminal for transmitting a first output data signal corresponding to the first input data signal, the first output data signal having the first bias voltage level;

a second output terminal for transmitting a second output data signal having the first bias voltage level, the second output data signal being a complementary signal of the first output data signal;

input means for generating the first and second output data signals in response to the first and second input data signals and providing the first and second output data signals to said first and second output terminals respectively while the clock signal is at a first logic level;

data latch means for receiving the first and second output signals at a first edge of the clock signal in which a transition from a second logic level to the first logic level occurs, said data latch means latching the first and second output signals while the clock signal is at the second logic level;

drive means for driving said data latch means to be activated at a second edge, subsequent to the first edge, of the clock signal, in which a transition from the first logic level to the second logic level occurs; and a current source commonly connected to said input means and said drive means.

8. An ECL latch circuit comprising:

a first input terminal for receiving a first input data signal having a first bias voltage level;

a second input terminal for receiving a second input data signal having the first bias voltage level, the second input data signal being a complementary signal of the first input data signal;

a third input terminal for receiving a clock signal having a second bias voltage level higher than the first bias voltage level;

a first output terminal for transmitting a first output data signal corresponding to the first input data signal;

a second output terminal for transmitting a second output data signal, the second output data signal being a complementary signal of the first output data signal;

input means for generating the first and second output data signals in response to the first and second input data signals and providing the first and second output data signals to said first and second output terminals respectively while the clock signal is at a first logic level;

data latch means for receiving the first and second output signals at a first edge of the clock signal in which a transition from the first logic level to a second logic level occurs, said data latch means latching the first and second output signals while the clock signal is at the second logic level;

drive means for driving said data latch means to be activated at the first edge, subsequent to a second edge in which a transition from the second logic level to the first logic level occurs, of the clock signal; and a current source commonly connected to said input means and said drive means.

9. An ECL latch circuit according to claim 8 wherein:

the slave input circuit includes:

a first transistor having a first terminal coupled to receive a first slave input signal, a second terminal coupled to the slave current source, and a third terminal coupled to a first slave output terminal, a second transistor having a first terminal coupled to receive a second slave input signal, a second terminal coupled to the slave current source, and a third terminal coupled to a second slave output terminal, a first resistor coupled between the first slave output terminal and a power supply, and a second resistor coupled between the second output terminal and the power supply;

the clock driver includes a third transistor having a first terminal coupled to receive a slave clock signal, a second terminal coupled to the slave current source, and a third terminal coupled to the slave data latch; and the slave data latch includes:

a fourth transistor having a first terminal coupled to the second slave output terminal, a second terminal coupled to the clock driver, and a third terminal coupled to the first slave output terminal, and a fifth transistor having a first terminal coupled to the first slave output terminal, a second terminal coupled to the clock driver, and a third terminal coupled to the second slave output terminal.

* * * * *